(12) United States Patent
Sundaram et al.

(10) Patent No.: US 9,024,296 B2
(45) Date of Patent: May 5, 2015

(54) FOCAL PLANE ARRAY WITH PIXELS DEFINED BY MODULATION OF SURFACE FERMI ENERGY

(71) Applicants: Mani Sundaram, Lexington, MA (US); Axel Reisinger, Amherst, NH (US)

(72) Inventors: Mani Sundaram, Lexington, MA (US); Axel Reisinger, Amherst, NH (US)

( * ) Notice: Subject to any disclaimer, the term of this patent is extended or adjusted under 35 U.S.C. 154(b) by 0 days.

(21) Appl. No.: 14/147,716

(22) Filed: Jan. 6, 2014

(65) Prior Publication Data

US 2014/0191195 A1    Jul. 10, 2014

Related U.S. Application Data

(60) Provisional application No. 61/748,958, filed on Jan. 4, 2013.

(51) Int. Cl.
*H01L 27/146* (2006.01)
*H01L 31/0352* (2006.01)

(52) U.S. Cl.
CPC ....... *H01L 27/1463* (2013.01); *H01L 27/14683* (2013.01); *H01L 31/035236* (2013.01)

(58) Field of Classification Search
CPC ............... H01L 27/14683; H01L 27/14603; H01L 31/035236; H01L 31/1037; H01L 31/03045; H01L 31/1013; H01L 31/0304
USPC ........... 257/21, 184, 431, 441; 438/73, 57, 94
See application file for complete search history.

(56) References Cited

U.S. PATENT DOCUMENTS

| 7,687,871 | B2 * | 3/2010 | Maimon | 257/441 |
|---|---|---|---|---|
| 7,737,411 | B2 | 6/2010 | Gunapala et al. | |
| 7,795,640 | B2 | 9/2010 | Klipstein | |
| 7,928,473 | B2 | 4/2011 | Klipstein | |
| 8,003,434 | B2 | 8/2011 | Maimon | |
| 8,004,012 | B2 | 8/2011 | Klipstein | |
| 8,274,096 | B2 | 9/2012 | Wicks | |

OTHER PUBLICATIONS

Nguyen, Chah et al., "Surface donor contribution to electron sheet concentrations in not intentionally doped InAsAlSb quantum wells", Applied Physics Letters, Apr. 13, 1992, pp. 1854-1856, vol. 60, No. 15.

(Continued)

*Primary Examiner* — Nikolay Yushin
(74) *Attorney, Agent, or Firm* — Maine Cernota & Rardin

(57) ABSTRACT

Pixels in a focal plane array are defined by controlled variation of the Fermi energy at the surface of the detector array. Varying the chemical composition of the semiconductor at the detector surface produces a corresponding variation in the surface Fermi energy which produces a corresponding variation in the electric field and electrostatic potential in the bulk semiconductor below the surface. This defines pixels by having one Fermi energy at the surface of each pixel and a different Fermi energy at the surface between pixels. Fermi energy modulation can also be controlled by applying an electrostatic potential voltage V1 to the metal pad defining each pixel, and applying a different electrostatic potential voltage V2 to an interconnected metal grid covering the gaps between all the pixel metal pads. Methods obviate the need to etch deep trenches between pixels, resulting in a more manufacturable quasi-planar process without sacrificing performance.

24 Claims, 10 Drawing Sheets

METHOD FLOW CHART

(56) References Cited

OTHER PUBLICATIONS

Nguyen, Chah et al., "Magnetotransport in lateral periodic potentials formed by surface layer induced modulation in InAs—AlSb quantum wells", Applied Physics Letters, Oct. 10, 1993, pp. 2251-2253, vol. 63, No. 16.

Das, Sankha D. et al., "Infrared photodiodes based on Type-II strained layer superlattices", Proc. of SPIE, 2008, 10 pages, vol. 7113.

Sundaram, Mani, et al., "1024x1024 LWIR SLS FPAs—Status and Characterization", Proc. of SPIE, 2012, 9 pages.

* cited by examiner

PERSPECTIVE VIEW OF REGION OF PIXELS DEFINED BY SURFACE
COMPOSITION MODULATION
(NOT TO SCALE)

SECTION VIEW OF PIXELS OF FPA STRUCTURE DEFINED BY SURFACE COMPOSITION MODULATION
(NOT TO SCALE)

SECTION A - A' OF FIG. 2

ENERGY BAND DIAGRAM
VERTICALLY THROUGH MIDDLE OF A PIXEL FROM TOP SURFACE TO
SUBSTRATE

SECTION B-B' OF FIG. 2
ENERGY BAND DIAGRAM
VERTICALLY IN GAP BETWEEN ADJACENT PIXELS FROM TOP SURFACE TO SUBSTRATE

PERSPECTIVE VIEW OF PIXELS DEFINED BY GRID AND PADS
(NOT TO SCALE)

SPECTRAL RESPONSE OF HOT MIDWAVE MATERIAL

NOISE EQUIVALENT TEMPERATURE DIFFERENCE OF A HOT MIDWAVE FPA AS A FUNCTION OF DEVICE OPERATING TEMPERATURE

SPECTRALLY AVERAGED QUANTUM EFFICIENCY PLOTTED AGAINST DEVICE
OPERATING TEMPERATURE

SEQUENCE OF FRAMES FROM 80 K TO 170 K, ILLUSTRATING IMAGE QUALITY

METHOD FLOW CHART

FOCAL PLANE ARRAY WITH PIXELS DEFINED BY MODULATION OF SURFACE FERMI ENERGY

RELATED APPLICATIONS

This application claims the benefit of U.S. Provisional Application No. 61/748,958, filed Jan. 4, 2013. This application is herein incorporated in its entirety by reference.

FIELD OF THE INVENTION

The invention relates to focal plane array (FPA) sensors, and more particularly, to a focal plane array with pixels defined by modulation of surface Fermi energy.

BACKGROUND OF THE INVENTION

Focal plane arrays typically consist of two dimensional arrays of individual and separate detectors—or pixels—which must be physically isolated from one another (mesas) in order to be able to generate an image of a scene devoid of any crosstalk or signal admixture between adjacent pixels. The detectors themselves are commonly made of an appropriate semiconductor material, regions of which can be doped either p-type or n-type. The junction between regions of opposite doping characters forms a so-called p-n photodiode which has the important ability to generate an electrical current when exposed to the appropriate illumination. While the doping can be created in a two dimensional pattern of islands in bulk material by techniques such as impurity diffusion or ion implantation, modern focal plane arrays are commonly fabricated by methods such as molecular beam epitaxy (MBE) or chemical vapor deposition (CVD). In MBE and CVD, semiconductor layers of different doping types are epitaxially grown sequentially in situ. In this case, the p-n junction is buried at some depth below the surface of the wafer down the sequence of grown layers over the entire substrate. Subsequent processing demands that trenches be etched in a two-dimensional mesa pattern in order to define individual pixels. Indeed, vertical mesa walls can be several microns deep. There are significant drawbacks to the requirement that trenches be etched in a two-dimensional mesa pattern in order to define individual pixels. First, the fabrication becomes significantly more complicated. Second, the etching exposes the p-n junction, introducing the possibility of surface leakage current, which often requires some passivation technique to mitigate. U.S. patents describing photodetector design approaches include U.S. Pat. Nos. 7,687,871, 7,737,411, 7,795,640, 7,928,473, 8,003,434, 8,004,012, and U.S. Pat. No. 8,274,096. Papers describing effects include Chanh Nguyen, Berinder Brar, Herbert Kroemer, and John H, English, Surface donor contribution to electron sheet concentrations in not intentionally doped InAsAlSb quantum wells, Applied Physics Letters, vol. 60, No. 15, 13 Apr. 1992, pages 1854-1856 and Chanh Nguyen, Berinder Brar, Vijay Jayaraman, Axel Lorke, and Herbert Kroemer, Magnetotransport in lateral periodic potentials formed by surface layer induced modulation in InAsAlSb quantum wells, vol. 63, No. 16, 10 Oct. 1993, pages 2251-2253. All references, including publications, patent applications, and patents, cited herein are hereby incorporated by reference to the same extent as if each reference were individually and specifically indicated to be incorporated by reference and were set forth in its entirety herein.

What is needed is a focal plane array that is simpler to fabricate and that mitigates surface current leakage without passivation.

SUMMARY OF THE INVENTION

Embodiments address these needs with a focal plane array (FPA) where the pixels are defined, not by the usual methods of selective diffusion or selective ion-implantation or etching trenches (i.e. removing detector material between pixels), but by a deliberate and controlled variation of the Fermi energy at the surface of the detector array. Embodiments dispense entirely with any deep etching to delineate individual pixels. They rely, instead, on very shallow etching of a single cap layer that is typically no more than 200 Ångströms thick. The p-n junction proper remains safely buried well below the surface of the semiconductor material, thereby minimizing the possibility of detrimental surface leakage. The absence of vertical mesa walls—potentially several microns deep—affords a much simplified fabrication process resulting in a quasi planar structure during detector fabrication.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter. The invention is susceptible of many embodiments. What follows is illustrative, but not exhaustive, of the scope of the invention.

One embodiment provides a semiconductor planar structure device comprising at least one region defined by controlled variation of the Fermi energy at a surface comprising at least one pixel comprising a pixel pad having a perimeter; a gap surrounding the perimeter of the pixel pad; a detector layer beneath the at least one pixel pad and the gap, wherein the pixels are defined by having a first Fermi energy at a surface of each the pixel pad and a second Fermi energy at a surface at the gap between the pixels, whereby variation between the first Fermi energy and the second Fermi energy produces a corresponding lateral variation in the electric field and the electrostatic potential in the detector layer below the surface of the pixel pad and the gap. In another embodiment, the device is a high operating temperature midwave infrared focal plane array with a half maximum cutoff wavelength of about 5.1 microns. For a further embodiment, the detector layer comprises a bulk semiconductor whose energy bandgap, and therefore cutoff wavelength, is determined by material composition of the bulk semiconductor, with a cutoff wavelength between about 400 nanometers (ultraviolet) and about 1 millimeter (far infrared). In a subsequent embodiment, the detector layer comprises a superlattice whose energy bandgap, and therefore cutoff wavelength, is determined by the materials and the period of the superlattice, with a cutoff wavelength between about 400 nanometers and about 1 millimeter. Other embodiments further comprise a readout multiplexer to generate video imagery. For following embodiments, the device comprises a type II superlattice wherein high contrast images are produced by the detector device when used in an imaging system. Yet other embodiments provide that the Fermi energy variation is controlled by applying an electrostatic potential voltage V1 to a metal pad defining each pixel and applying a different electrostatic potential voltage V2 to an interconnected metal grid within the gaps between the metal pads defining each pixel. For other embodiments, the detector layer comprises sequentially deposited semiconductor planar layers forming either a p-n junction or an n-p junction configured to generate a photocurrent when illuminated by light radiation; a planar semiconductor first cap layer above the detector, the first cap layer comprising a first semiconductor material; a planar semiconductor second cap layer above the first cap layer, the second cap layer comprising a second semiconductor material, the gap being defined by selectively removing the second cap layer in the region between pixels, wherein the first semiconductor material and the said second semiconductor material are dissimilar; the first semiconductor material and the second semiconductor material having different surface state characteristics such that the Fermi level at the surface of the first cap layer is pinned at a first Fermi energy level and the Fermi level at the surface of the second cap layer is pinned at a second Fermi energy level, and wherein the first Fermi energy level is not equal to the second Fermi energy level. In additional embodiments, an optically active part of the detector comprises one or more barriers, wherein the one or more barriers curtail the magnitude of generation-recombination currents within junction regions, whereby performance does not degrade at higher temperature operations compared to p-n or n-p junction photodiodes that exclude the one or more barriers. In some embodiments, contact to each pixel is through a metal contact pad deposited on top of each of the second cap layer pixel pads. Additional embodiments provide that surface leakage currents are eliminated because edges of the p-n or n-p junctions are buried in an interior of the semiconductor structure, not exposed to a semiconductor surface. For embodiments, the optical fill factor is 100%. In alternate embodiments, lateral conductivity of the first cap layer in the gaps between the pixels is reduced so that inter-pixel crosstalk is about zero. In included embodiments the thickness of the first cap layer is about 200 Angströms, the thickness of the second cap layer is about 200 Angströms, and the depth of the gap between pixels is about 200 Angströms. In alternate embodiments, the second cap layer is etched away producing the pixel pads so as to leave only the first cap layer in a two dimensional array of semiconductor islands in such a way that the transfer of surface charge carriers leads to one carrier density in the interior of the islands and another, different, carrier density in the interior of regions between the islands, resulting in a two dimensional modulation of carrier concentration. In embodiment examples, etching of the second cap layer exclusively defines a two dimensional array of individual pixels, excluding etching deep trenches for p-n or n-p junctions.

One more embodiment provides a method for fabricating a focal plane array (FPA) comprising providing a substrate; providing a common contact layer on the substrate; providing an absorber layer on the common contact layer; providing a barrier layer on the absorber layer; providing a cap one layer on the barrier layer; providing a cap two layer on the cap one layer; selectively etching the cap two layer to delineate pixels of the FPA; providing a metal contact layer on the defined cap two layer; and providing a metal common contact layer to the common contact layer. In a plurality of embodiments, the barrier layer comprises aluminum arsenide antimonide (AlAsSb); the absorber layer comprises a Type II superlattice; the cap one layer comprises gallium antimonide (GaSb), and the cap two layer comprises indium arsenide (InAs).

A further embodiment provides a high operating temperature midwave infrared focal plane array detector system comprising a substrate layer comprising gallium antimonide (GaSb); a common conducting layer on the substrate; an absorber layer comprising a Type II superlattice; a barrier layer on the absorber layer, thickness of the barrier layer being between about 0.1 micron and about 0.5 micron, doping of the barrier layer being less than about $1e16\ cm^{-3}$; a first cap layer comprising gallium antimonide (GaSb), thickness of the first cap layer being about 200 Angströms; a second cap layer comprising indium arsenide (InAs), the second cap layer etched to form gaps between pixels of the detector, thickness of the second cap layer being about 200 Angströms, depth of the gaps being about 200 Angströms; at least one metal contact pixel pad, photolithographically formed on top of each pixel, wherein the surface Fermi energy amplitude is about 250 meV, wherein the optical fill-factor is about 100%, wherein the spectrally averaged quantum efficiency is about 85% over a temperature range from about 80K to about 150K, wherein the noise-equivalent temperature difference does not exceed about 30 millikelvin up to an operating temperature of about 130 K with F/4 optics, and a half maximum cutoff wavelength of about 5.1 microns. For following embodiments, each pixel of the detector array is electrically connected to a corresponding unit cell on a matching readout multiplexer array to form a hybrid focal plane array. In at least one embodiment, electrical connections comprise metallic bumps using a metal selected from the group consisting of indium, gold, tin, or a gold-tin alloy.

DETAILED DESCRIPTION

Figure 1:
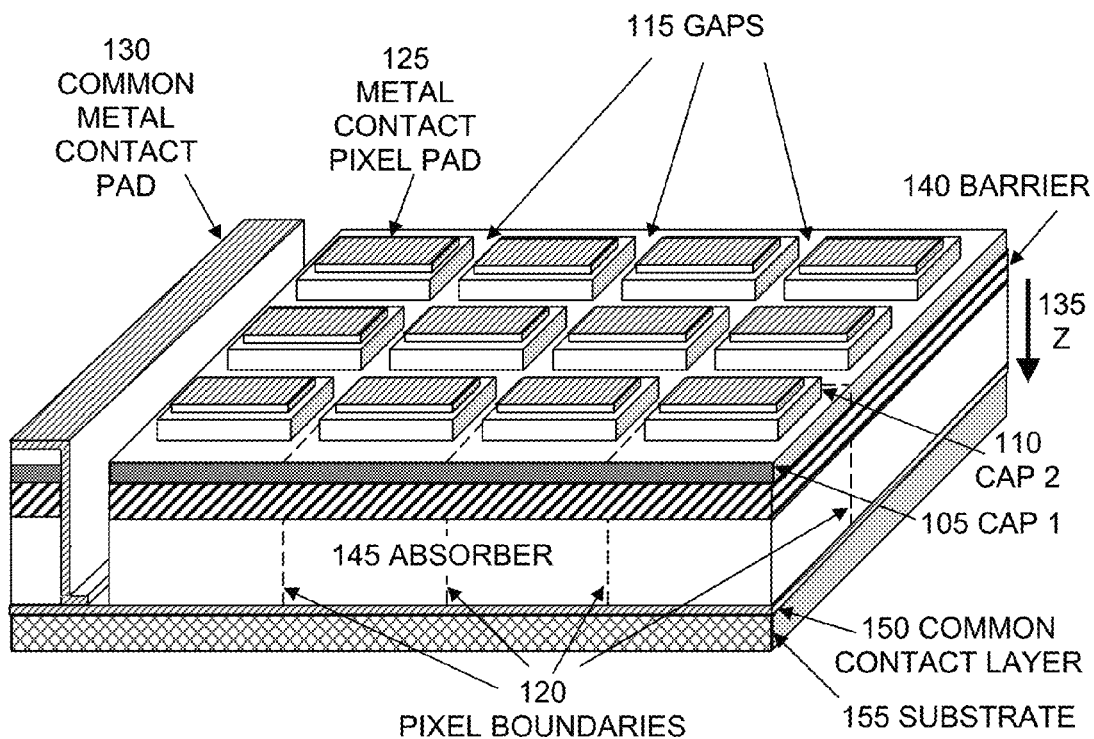
FIG. 1 is a perspective view of the overall FPA structure near one edge of the FPA configured in accordance with one embodiment of the present invention.

Embodiments comprise a method of surface Fermi energy modulation by a controlled variation of the chemical composition of the detector surface. The Fermi energy level at which the free surface of a semiconductor is pinned with respect to its energy bandgap is unique to that semiconductor and varies from one semiconductor to another; it is a function of surface states which, in turn, depend on the density and composition of surface oxides as well as surface dangling bonds. The net result is the presence at the surface and some distance below it of a net excess of charge carriers (electrons or holes) or a net depletion of them.

Varying the chemical composition of the semiconductor at a detector surface produces a corresponding variation in the surface Fermi energy (e.g. 250 meV in amplitude) which, in turn, produces a corresponding variation in the electric field and electrostatic potential in the bulk semiconductor below the surface. Embodiments exploit this effect to define pixels by having one Fermi energy at the surface of each pixel and a different Fermi energy at the surface between pixels (gaps). The lateral (xy plane) variation in surface Fermi energy translates to a lateral variation in electrostatic potential energy below the surface that matches the surface spatial pattern and whose amplitude decreases with depth, vanishing at large enough depths (typically a few microns).

Embodiments use this lateral electrostatic potential modulation to confine charge carriers (both photo and dark) to the area under the pixels and restrict them from neighboring pixels. Photocurrent from each pixel is collected between a single metal contact on the top side of each unit cell and a second electrical contact at the bottom side of all pixels connected in common.

Other embodiments include a method of surface Fermi energy modulation comprising applying an electrostatic potential voltage V1 the metal pad that defines each pixel and applying a different electrostatic potential voltage V2 to an interconnected metal grid that covers the gaps between all the pixel metal pads. This method is specifically analogous to the first method, except that the surface Fermi energy is now controlled, not by chemistry, but by externally applied voltages.

Particular embodiments comprise a strained layer superlattice (SLS) designed to operate in the MidWave InfraRed (MWIR) portion of the electromagnetic spectrum at operating temperatures as high as 150 K (the field is referred to by those skilled in the art as "High Operating Temperature," or "HOT," midwave). In the present embodiment, the growth of the absorbing SLS region of the structure is terminated by two successive cap layers. The first cap layer is a layer of gallium antimonide (GaSb), itself covered by a final cap layer of indium arsenide (InAs). Spatial modulation of the pinning position of the Fermi level at the outer surface of the sample is accomplished very simply by etching away the thin InAs layer between pixels. In significant distinction from the prior art, in known systems the photocarriers are transported only in one of the two bands, viz. the valence band. In the present invention, the photocarriers move from one band to the other at the junction between the two cap layers, viz. from valence band to conduction band in the embodiment shown. This is a critical difference that improves the transport and collection of photocarriers in the present invention, compared to the single-band transport in reference patents and papers. Neither cap layer is intentionally doped and, furthermore, both are thin enough—only on the order of a few hundred Angströms each—to not impede current flow in the vertical direction, i.e., across layers to the metal contact. Furthermore, and equally importantly, their lateral conductivity is small enough to effectively prevent any migration of carriers from one pixel to any of the adjacent ones. This is an important attribute to ensure that the FPA will produce sharp, crisp images free of any inter-pixel crosstalk. A further advantage of this design is that given the lack of deeply etched trenches to delineate isolated pixels, excess carriers photo-generated exactly at the mid-point between two adjacent pixels have an equal chance to be swept horizontally to one side or the other and will ultimately be collected by one electrical contact. Since "dead zones" between pixels have been entirely dispensed with, the fill factor is as high as it can be, namely, 100%.

FIG. 1 depicts a perspective view 100 of the overall FPA structure near one edge of the FPA. The z-axis, here 135, is common to each of FIGS. 1-4. Structure elements comprise cap one 105, cap two 110, gaps 115 between caps, pixel boundaries 120 aligned with the centers of gaps 115, metal contact pixel pad 125, common metal contact pad 130; proceeding down along z-axis 135 from cap layer one 105 are barrier 140, absorber 145, common contact layer 150, and substrate 155. Barrier layer 140 and absorber 145 comprise the detector layer(s).

Figure 2:
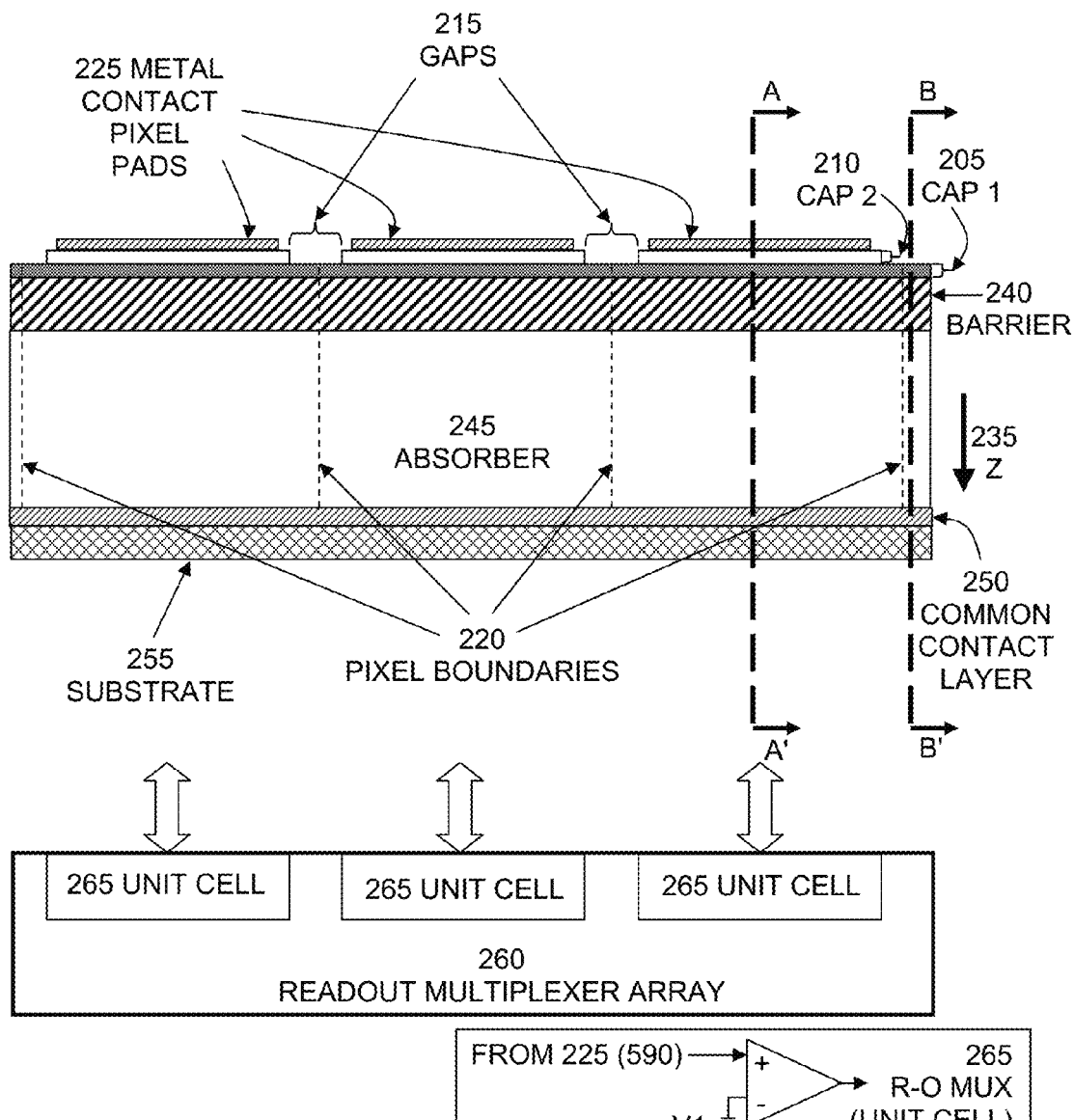
FIG. 2 is a cross-section view of a portion of the FPA structure of FIG. 1 configured in accordance with one embodiment of the present invention.

FIG. 2 depicts features of the structure of the focal plane array of FIG. 1 through a cross-section 200. The z-axis, here 235, is common to each of FIGS. 1-4. A series of semiconductor layers is grown sequentially on a suitable substrate 255. In embodiments, substrate 255 comprises gallium antimonide (GaSb). The structure includes absorbing/detector region 245. In embodiments, absorbing region 245 is a generic absorbing region. As in FIG. 1, barrier layer 240 and absorber 245 comprise the detector layer(s). For embodiments, "detector" material 245 is a generic photovoltaic diode with the rectifying diode junction close enough to the surface layers as to be affected by the surface Fermi energy modulation. For embodiments, this is approximately less than half a micron from the surface. Modifying the lateral electrostatic potential at the diode junction is important to the physical definition of the pixels. In this embodiment, detector absorber 245 comprises a Type II superlattice designed to have a cutoff wavelength around 5.1 microns. Absorbing region 245 is flanked on the bottom side by conducting layer 250 that is common to all pixels. The top side of the detector/absorbing region is comprised of two thin successive cap layers: cap one 205 and cap two 210. In the present embodiment, first cap layer 205 comprises gallium antimonide (GaSb), while second cap layer 210 comprises indium arsenide (InAs). As shown in FIGS. 1 and 2, final InAs cap layer (cap two 210) is etched away between adjacent pixels forming gaps 215. Pixels are defined beneath those areas where the cap layer 210 remains unetched. In embodiments, for the purpose of electrically accessing each pixel, metal contact pixel pads 225 are photolithographically made on top of each pixel. Electrical contact to the other side of the pixels is provided by another, common, metal pad (corresponding to 130 in FIG. 1; not shown in FIG. 2, but implied) reaching down to common contact layer 250. Corresponding to the array described above is readout multiplexer 260 to generate video imagery. Each pixel of the detector array (corresponding to metal contact pixel pads 225) is electrically connected to a corresponding unit cell 265 (shown simplified) on matching readout multiplexer array 260 to form a hybrid focal plane array.

Figure 3:
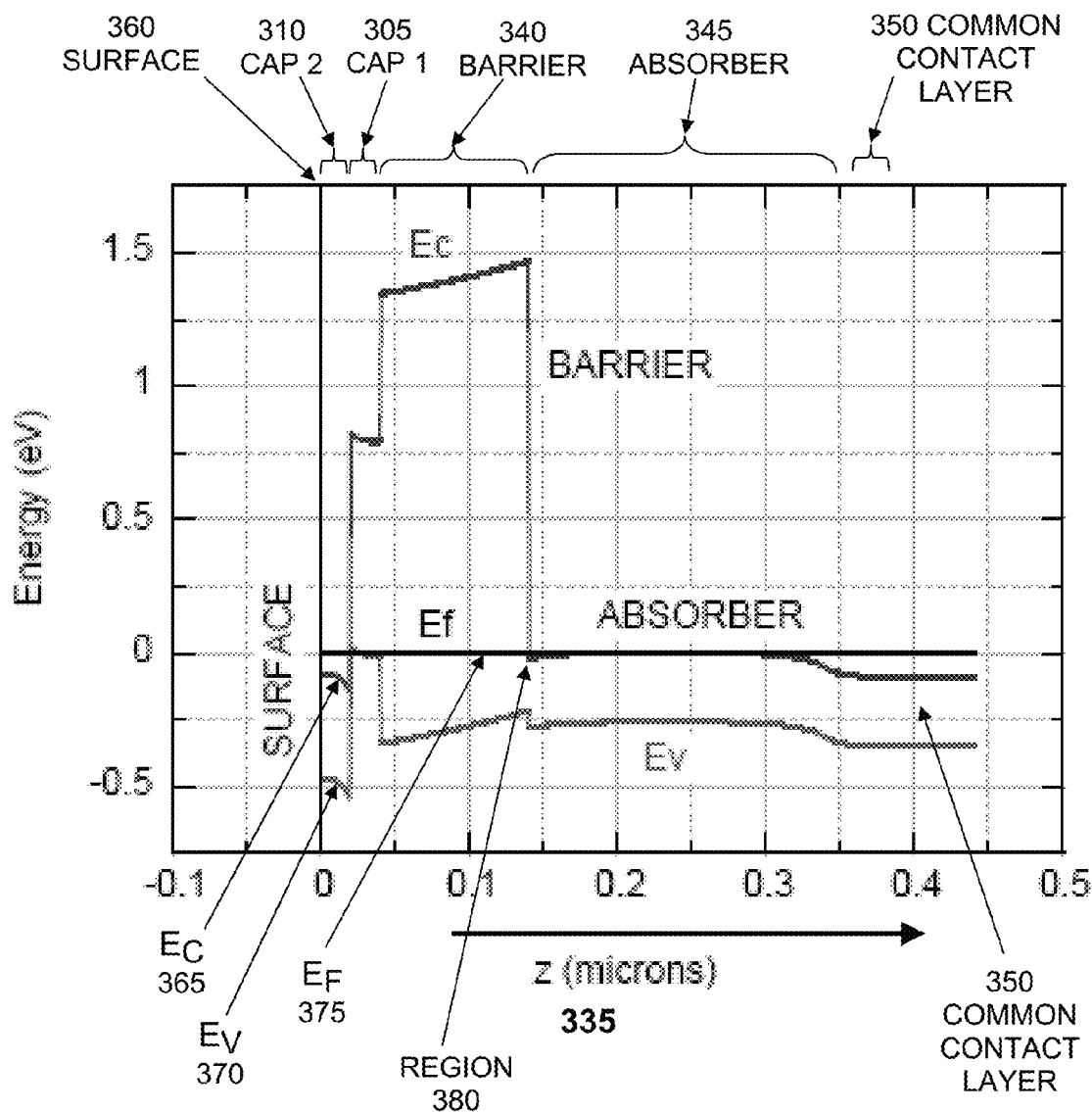
FIG. 3 is an energy band diagram for cross section A-A' of FIG. 2 going vertically through the middle of a pixel from the top surface down to the substrate configured in accordance with one embodiment of the present invention.

FIG. 3 shows the band diagram 300 corresponding to a cross section cutting through the middle of a pixel (section A-A' in FIG. 2). The z-axis, here 335, is common to each of FIGS. 1-4. The figure displays both conduction band $E_C$ 365 in region 380 and valence band $E_v$ 370. The detector consists of two parts: (1) a thick "absorber" layer 345 on a more heavily doped contact layer 350 of similar composition as that of "absorber" layer 345, and (2) a thinner "barrier" layer 340 that resides between absorber 345 and the two cap layers, cap one 305 and cap two 310. For embodiments, absorber 345 can be made from a variety of semiconductors such as GaAs, AlAs, GaSb, AlSb, InAs, InSb, HgTe, CdTe, etc. or their alloys with the cutoff wavelength defined by the semiconductor's energy bandgap. For embodiments, the detector's thickness is typically a few microns (e.g. 4-5 microns) in order to maximize light absorption and detector quantum efficiency and it is typically low-doped (e.g. <1e16 cm$^{-3}$) in order to maximize minority carrier lifetime and therefore minority photocarrier collection at the junction and quantum efficiency. Following absorber layer 345 is barrier layer 340. For other embodiments, including modeling, the detector's thickness is less than 1 micron. The barrier is typically thin (e.g. 0.1-0.5 micron) in order to keep the junction as close to the surface as possible, low-doped (e.g. <1e16 cm$^{-3}$) so as to minimize the screening effect by any carriers of the surface Fermi energy on the junction below, and bandgap-engineered in such a way as to not impede the flow of minority photocarriers vertically up from the junction to the cap. The barrier material is typically a semiconductor with an energy bandgap identical to or larger than the absorber and a band-lineup such that the minority photocarriers (holes in the present embodiment) see a negligible potential barrier travelling from absorber to barrier. In embodiments, barrier 340 is aluminum arsenide antimonide (AlAsSb) containing just enough arsenic to minimize lattice mismatch (e.g. 5%-10%). Completing the structure going out toward the surface is GaSb cap layer one 305 followed by InAs cap layer two 310. The barrier presents an insurmountable obstacle to the flow of majority carriers (electrons in the present embodiment). The minority carriers (holes in the present embodiment), on the other hand, can flow without hindrance from absorber to cap one. The possibility of holes getting trapped in the GaSb cap (keeping in mind that hole wells are inverted upside down along the energy axis when compared to electron wells) is precluded by the very thin dimension of that layer. At the interface between the cap one 305 and cap two 310 layers, the holes get converted into electrons, moving from the valence band of cap one layer 305 into the conduction band of cap two layer 310.

Figure 4:
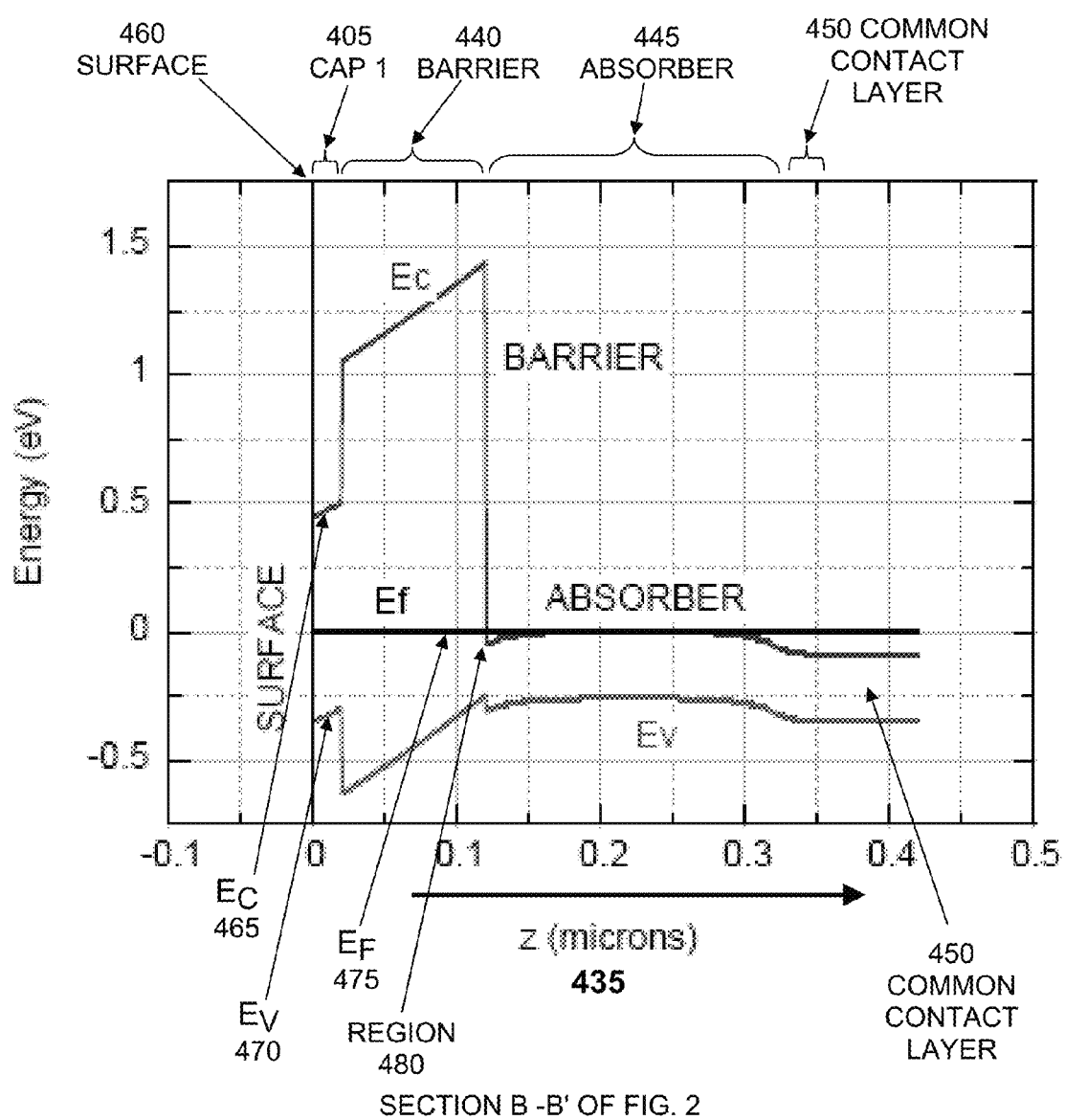
FIG. 4 is an energy band diagram for cross section B-B' of FIG. 2 in the gap between adjacent pixels going vertically from the top surface down to the substrate configured in accordance with one embodiment of the present invention.

FIG. 4 shows a band diagram 400 similar to the band diagram of FIG. 3, but in the gap region between adjacent pixels (section B-B' in FIG. 2). The z-axis, here 435, is common to each of FIGS. 1-4. The topmost InAs cap layer two (210 in FIG. 2) is now absent to reflect the fact that that layer is etched away in that region. Conduction band $E_C$ 465 in region 480 between absorber 445 and barrier 440 presents a deeper notch in FIG. 4 than in FIG. 3 (notches at 480 and 380, respectively). This implies a greater accumulation of majority carriers (electrons) between pixels than directly under them. As a corollary, there is a correspondingly greater shortage of minority carriers (holes) in notch 480 between the pixels in FIG. 4 than in notch 380 under the pixels in FIG. 3, which simply means that minority holes will tend to collect under pixels rather than in the gaps between them.

Figure 5:
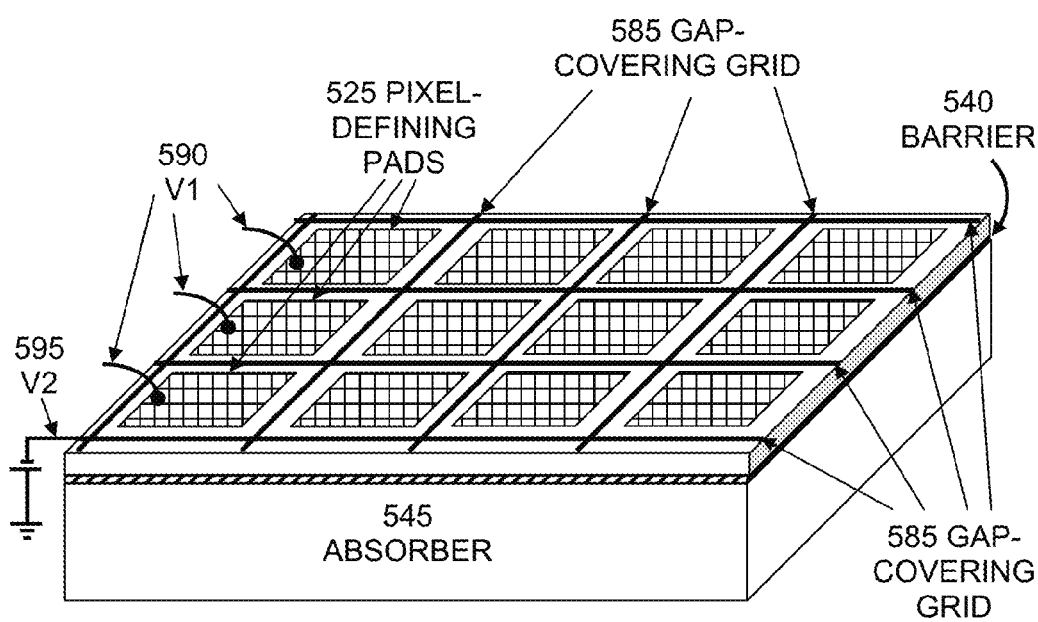
FIG. 5 is a perspective view of another embodiment of the FPA structure configured in accordance with one embodiment of the present invention.

FIG. 5 is a perspective view 500 of another embodiment of the overall FPA structure. Embodiments include a method of surface Fermi energy modulation comprising applying an electrostatic potential 590 voltage V1 to the metal pad 525 that defines each pixel and applying a different electrostatic potential 595 voltage V2 to an interconnected metal grid 585 that covers the gaps between all the pixel metal pads 525. Note that while voltage 590 V1 is applied to every metal pixel pad 525, in FIG. 5 it is depicted for only three adjacent metal pixel pads. This method is specifically analogous to the first method, except that the surface Fermi energy is now controlled, not by chemistry, but by externally applied voltages 590 and 595. Detector structure comprises barrier 540 and absorber 545. In embodiments, the metal pads are directly either on the barrier or on a cap layer above the barrier that facilitates a better electrical connection to the pixel. In embodiments, the grid metal is typically directly on the barrier, and typical values for 590 V1 are −0.5 volt and 595 V2=+1 volt.

Figure 6:
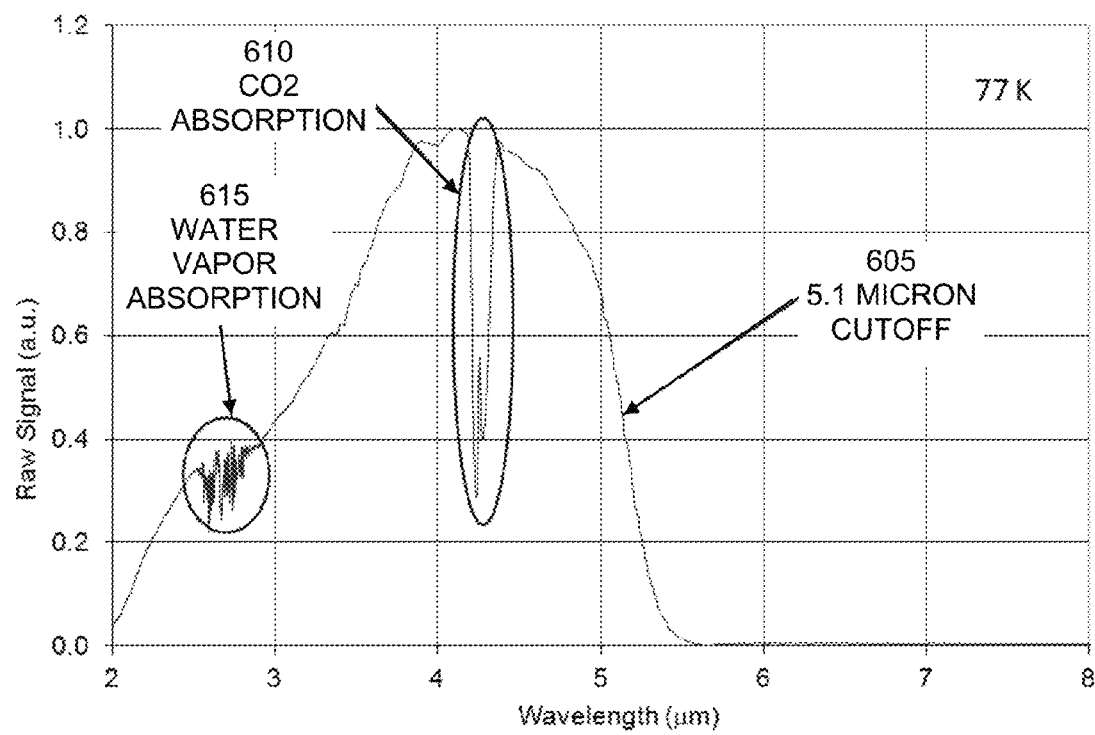
FIG. 6 shows the spectral response of a High Operating Temperature (HOT) midwave material for a pixel delineation technique configured in accordance with one embodiment of the present invention.

FIG. 6 is a spectral response 600 of the focal plane material discussed in the context of the present embodiment. Sharp drop off 605 at half maximum shows a cutoff wavelength of 5.1 microns. Key to achieving this value is an absorber design using a Type II superlattice, in distinct contrast to the more traditional bulk InGaSb material lattice-matched to GaSb substrate, the cutoff wavelength of which is limited to 4.2 microns. The double-dip spectral feature 610 at 4.2-4.3 microns is due to carbon dioxide absorption, while multi-line spectral features 615 are attributable to water vapor absorption. Features 610 and 615 are environment artifacts that do not affect the position of cutoff 605 at 5.1 microns.

Figure 7:
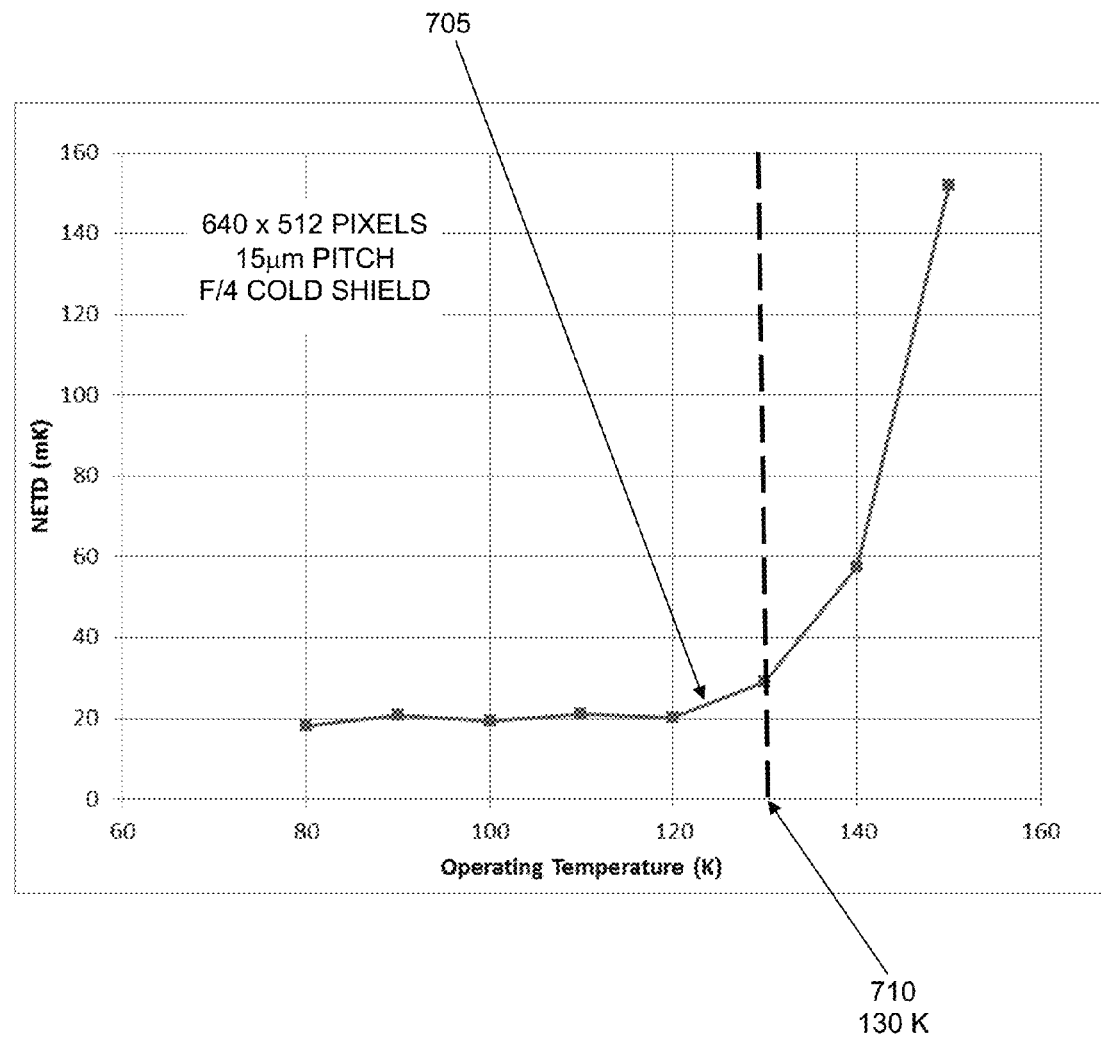
FIG. 7 shows the noise equivalent temperature difference (NETD) of a HOT midwave focal plane array as a function of device operating temperature configured in accordance with one embodiment of the present invention.

FIG. 7 is a plot 700 of the noise-equivalent temperature difference (NETD) measured in a representative focal plane array fabricated according to an embodiment of the invention. NETD is a performance metric commonly used to assess the level of temporal noise affecting an FPA. The figure shows that NETD 705 does not exceed 30 millikelvin (mK) up to an operating temperature of 130 K 710 with F/4 optics. The noise level increases above that temperature. For embodiments, by opening up the aperture to accept more photons, the upper limit of acceptable operating temperature is boosted to 150 K with F/2.5 optics. This data confirms the performance of FPAs fabricated by embodiments of this invention. This performance of FPA pixels defined by modulation of surface Fermi energy is state of the art, particularly in the midwave portion of the electromagnetic spectrum.

Figure 8:
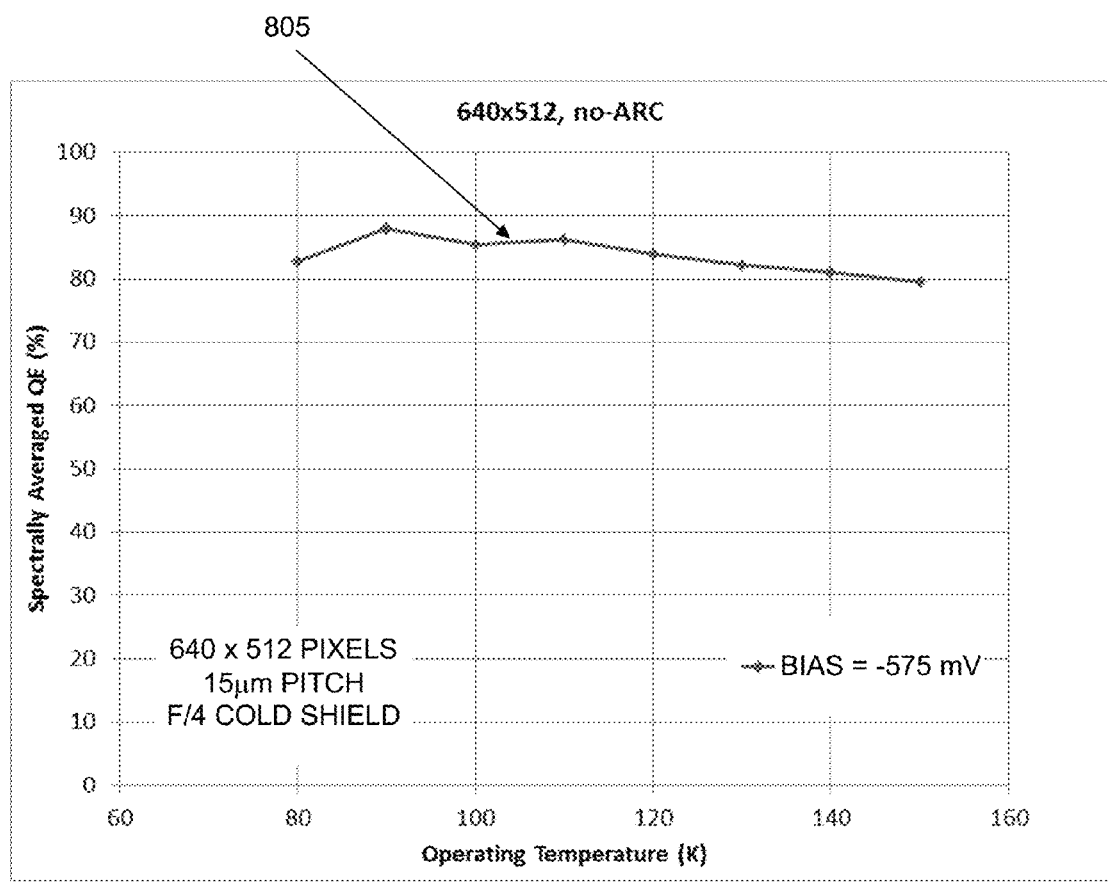
FIG. 8 is a plot of the spectrally averaged FPA quantum efficiency plotted against device operating temperature configured in accordance with one embodiment of the present invention.

FIG. 8 shows graphically 800 that the spectrally averaged quantum efficiency 805 is essentially constant at around 85% over the entire temperature span from 80K to 150K. This parameter is derived from measurements of the total photocurrent generated upon exposure to an extended area blackbody source at a known temperature divided by the total photon flux at that source temperature spectrally integrated up to the cutoff wavelength. The high value of this quantum efficiency data additionally confirms the performance provided by the method of using modulation of the surface Fermi energy to define individual pixels.

Figure 9:
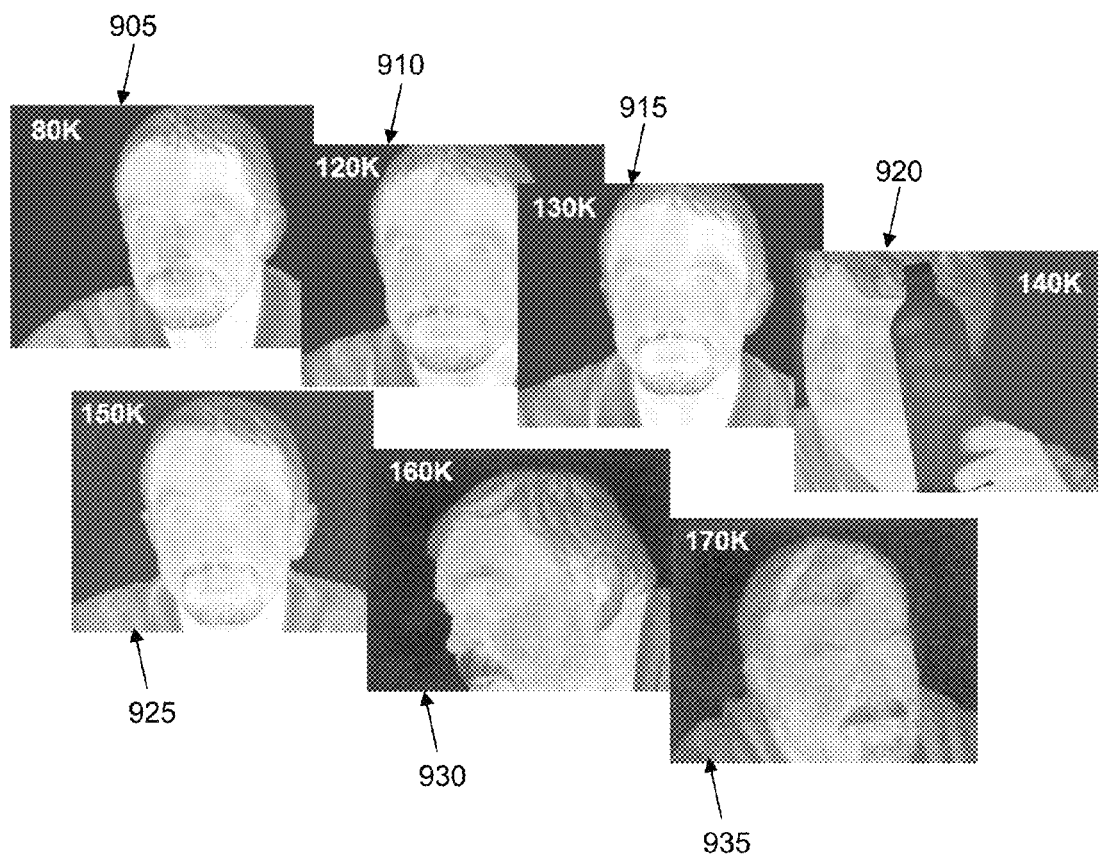
FIG. 9 presents a sequence of frames captured from a focal plane array of temperatures of 80 K up to 170 K configured in accordance with one embodiment of the present invention.

FIG. 9 presents images 900 produced by embodiments of the invention. Operating temperatures of specific images are 80K 905, 120K 910, 130K 915, 140K 920, 150K 925, 160K 930, and 170K 935. They illustrate how the quality of the images, captured here at F/4, only gradually decreases with increasing operating temperature. One implication is that the 30 mK threshold is somewhat arbitrary. Significantly, the sharpness of the images obtained at the lower operating temperatures clearly demonstrates that (1) the technique described here to define individual pixels is quite immune to inter-pixel crosstalk in spite of the extremely shallow etch depths (only a couple of hundred Angströms) between pixels and (2) that it is conducive to high pixel operability.

Figure 10:
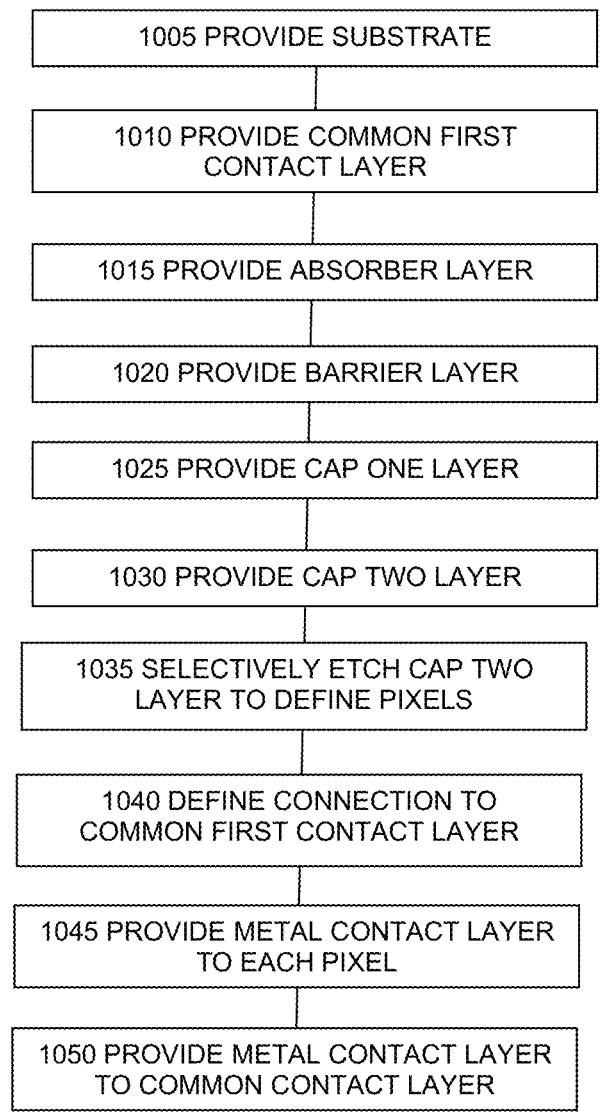
FIG. 10 is a flow chart of an FPA fabrication method configured in accordance with one embodiment of the present invention.

FIG. 10 is a flow chart 1000 of an FPA fabrication method configured in accordance with one embodiment of the present invention. Steps comprise providing a substrate 1005; providing a common first contact layer 1010; providing an absorber layer 1015; providing barrier layer 1020; providing cap one layer 1025; providing cap two layer 1030; defining pixels by selectively etching cap two layer 1035; defining connection to common first contact layer 1040; providing metal contact layer to each pixel 1045; and providing metal contact layer to common first contact layer 1050.

The foregoing description of the embodiments of the invention has been presented for the purposes of illustration and description. It is not intended to be exhaustive or to limit the invention to the precise form disclosed. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. A semiconductor planar structure device comprising at least one region defined by controlled variation of Fermi energy at a surface comprising:
   at least one pixel comprising a second cap layer having a perimeter;
   a gap surrounding said perimeter of said second cap layer;
   a first cap layer beneath said second cap layer;
   a detector layer beneath said first cap layer and said gap,
   wherein said at least one pixel is defined by having a first Fermi energy at a surface of each said second cap layer and a second Fermi energy at a surface at said gap,
   whereby variation between said first Fermi energy and said second Fermi energy produces a corresponding lateral variation in electric field and electrostatic potential in said detector layer below said surface of said second cap layer and said surface at said gap.

2. The device of claim 1, wherein said device is a high operating temperature midwave infrared focal plane array with a half maximum cutoff wavelength of about 5.1 microns.

3. The device of claim 1, wherein said detector layer comprises a bulk semiconductor whose energy bandgap, and therefore cutoff wavelength, is determined by material composition of said bulk semiconductor, with a cutoff wavelength between about 400 nanometers and about 1 millimeter.

4. The device of claim 1, wherein said detector layer comprises a superlattice whose energy bandgap, and therefore cutoff wavelength, is determined by materials and period of said superlattice, with a cutoff wavelength between about 400 nanometers and about 1 millimeter.

5. The device of claim 1, further comprising a readout multiplexer to generate video imagery.

6. The device of claim 1, comprising a Type II superlattice wherein high contrast images are produced by said detector device when used in an imaging system.

7. The device of claim 1, wherein said Fermi energy variation is controlled by applying an electrostatic potential voltage V1 to a metal pad defining each said at least one pixel and applying a different electrostatic potential voltage V2 to an interconnected metal grid within said gaps between said metal pads defining each said at least one pixel.

8. The device of claim 1, wherein said detector layer comprises sequentially deposited semiconductor planar layers forming either a p-n junction or an n-p junction configured to generate a photocurrent when illuminated by light radiation;
   said first cap layer comprising a planar semiconductor first cap layer above said detector, said first cap layer comprising a first semiconductor material;
   said second cap layer comprising a planar semiconductor second cap layer above said first cap layer, said second cap layer comprising a second semiconductor material, said gap being defined by selectively removing said second cap layer in region between pixels,
   wherein said first semiconductor material and said second semiconductor material are dissimilar;
   said first semiconductor material and said second semiconductor material having different surface state characteristics such that a Fermi level at a surface of said first cap layer is pinned at a first Fermi energy level and a Fermi level at a surface of said second cap layer is pinned at a second Fermi energy level, and
   wherein said first Fermi energy level is not equal to said second Fermi energy level.

9. The device of claim 8, wherein an optically active part of said detector comprises one or more barriers,
   wherein said one or more barriers curtail a magnitude of generation-recombination currents within junction regions,
   whereby performance does not degrade at higher temperature operations compared to p-n or n-p junction photodiodes that exclude said one or more barriers.

10. The device of claim 8, wherein contact to each said at least one pixel is through a metal contact pad deposited on top of each of said at least one pixel comprising said second cap layer.

11. The device of claim 8, wherein surface leakage currents are eliminated because edges of said p-n or n-p junctions are buried in an interior of said semiconductor structure, not exposed to a semiconductor surface.

12. The device of claim 8, wherein, optical fill factor is 100%.

13. The device of claim 8, wherein lateral conductivity of said first cap layer in said gaps between said pixels is reduced so that inter-pixel crosstalk is about zero.

14. The device of claim 8, wherein thickness of said first cap layer is about 200 Angströms, and
   thickness of said second cap layer is about 200 Angströms.

15. The device of claim 8, wherein depth of said gap between said pixels is about 200 Angströms.

16. The device of claim 8, wherein said second cap layer is etched away producing said pixels, so as to leave only said first cap layer in a two dimensional array of semiconductor islands in such a way that transfer of surface charge carriers leads to one carrier density in interior of said islands and another, different, carrier density in interior of regions between said islands, resulting in a two dimensional modulation of carrier concentration.

17. The device of claim 16, wherein said etching of said second cap layer exclusively defines a two dimensional array of individual pixels, excluding etching deep trenches for p-n or n-p junctions.

18. A method for fabricating a focal plane array (FPA) comprising:
   providing a substrate;
   providing a common contact layer on said substrate;
   providing an absorber layer on said common contact layer;
   providing a barrier layer on said absorber layer;
   providing a cap one layer on said barrier layer;
   providing a cap two layer on said cap one layer;
   selectively etching said cap two layer to delineate pixels of said FPA;
   providing a metal contact layer on said selectively etched cap two layer; and
   providing a metal common contact layer to said common contact layer.

19. The method of claim 18, wherein said barrier layer comprises aluminum arsenide antimonide (AlAsSb).

20. The method of claim 18, wherein said absorber layer comprises a Type II superlattice.

21. The method of claim 18, wherein said cap one layer comprises gallium antimonide (GaSb), and said selectively etched cap two layer comprises indium arsenide (InAs).

22. A high operating temperature midwave infrared focal plane array detector system comprising:
- a substrate layer comprising gallium antimonide (GaSb);
- a common conducting layer on said substrate;
- an absorber layer comprising a Type II superlattice;
- a barrier layer on said absorber layer, thickness of said barrier layer being between about 0.1 micron and about 0.5 micron, doping of said barrier layer being less than about 1e16 cm-3;
- a first cap layer comprising gallium antimonide (GaSb), thickness of said first cap layer being about 200 Angströms;
- a second cap layer comprising indium arsenide (InAs), said second cap layer etched to form gaps between pixels of said detector, thickness of said second cap layer being about 200 Angströms, depth of said gaps being about 200 Angströms;
- at least one metal contact pixel pad, photolithographically formed on top of each said pixel,
- wherein surface Fermi energy amplitude is about 250 meV,
- wherein optical fill-factor is about 100%,
- wherein spectrally averaged quantum efficiency is about 85% over a temperature range from about 80K to about 150K,
- wherein a noise-equivalent temperature difference does not exceed about 30 millikelvin up to an operating temperature of about 130K with F/4 optics, and
- half maximum cutoff wavelength of about 5.1 microns.

23. The device of claim 22, wherein each pixel of said detector array is electrically connected to a corresponding unit cell on a matching readout multiplexer array to form a hybrid focal plane array.

24. The device of claim 23, wherein electrical connections comprise metallic bumps using a metal selected from the group consisting of indium, gold, tin, and a gold-tin alloy.

* * * * *